(12) United States Patent
Xu

(10) Patent No.: US 12,174,265 B2
(45) Date of Patent: Dec. 24, 2024

(54) FAULT ISOLATION ANALYSIS METHOD AND COMPUTER-READABLE STORAGE MEDIUM

(71) Applicant: CHANGXIN MEMORY TECHNOLOGIES, INC., Anhui (CN)

(72) Inventor: Yuanjie Xu, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 402 days.

(21) Appl. No.: 17/648,457

(22) Filed: Jan. 20, 2022

(65) Prior Publication Data

US 2022/0254691 A1 Aug. 11, 2022

Related U.S. Application Data (63) Continuation of application No. PCT/CN2021/103478, filed on Jun. 30, 2021.

(30) Foreign Application Priority Data

Feb. 7, 2021 (CN) .......................... 202110168367.4

(51) Int. Cl.
*G01R 31/52* (2020.01)
*G01R 31/303* (2006.01)

(52) U.S. Cl.
CPC ........... *G01R 31/52* (2020.01); *G01R 31/303* (2013.01)

(58) Field of Classification Search
CPC ................................ H01L 22/22; H01L 22/14
See application file for complete search history.

(56) References Cited

U.S. PATENT DOCUMENTS

| 6,204,075 B1 | 3/2001 | Kikuchi |
| 9,208,827 B2 | 12/2015 | Lee et al. |
| 9,263,419 B2 | 2/2016 | Khoo et al. |

(Continued)

FOREIGN PATENT DOCUMENTS

| CN | 101644735 A | 2/2010 |
| CN | 101769975 A | 7/2010 |
| CN | 103353578 A | 10/2013 |

(Continued)

OTHER PUBLICATIONS

China first office action in Application No. 202110168367.4, mailed on May 31, 2022.

(Continued)

*Primary Examiner* — Yu-Hsi D Sun
(74) *Attorney, Agent, or Firm* — Syncoda LLC; Feng Ma (57) ABSTRACT

A fault isolation analysis method includes: providing a package structure in which there is an electrical fault; detecting whether the electrical fault is in interconnecting wires, and if the electrical fault is in the interconnecting wires, determining that the electrical fault is caused by the interconnecting wire; and if the electrical fault is not in the interconnecting wires, breaking the interconnecting wires to electrically isolate the chip structure from the substrate, then detecting whether the electrical fault is in the structure, and if the electrical fault is able to be detected, determining that the electrical fault is caused by the substrate, or if the electrical fault is not able to be detected, determining that the electrical fault is caused by the chip structure.

15 Claims, 7 Drawing Sheets

(56) References Cited

U.S. PATENT DOCUMENTS

2019/0013292 A1* 1/2019 Huang ............... H01L 25/0652

FOREIGN PATENT DOCUMENTS

| | | |
|---|---|---|
| CN | 106158741 A | 11/2016 |
| CN | 106841893 A | 6/2017 |
| CN | 107907781 A | 4/2018 |
| CN | 109192675 A | 1/2019 |
| CN | 110636712 A | 12/2019 |
| CN | 110767561 A | 2/2020 |
| CN | 112017986 A | 12/2020 |
| CN | 112992709 A | 6/2021 |
| JP | H07307371 A | 11/1995 |
| JP | 2015172530 A | 10/2015 |
| KR | 20100112458 A | 10/2010 |

OTHER PUBLICATIONS

PCB circuit board short circuit inspection method, chenke0976ck, Jul. 23, 2012 https://wenku.baidu.com/view/992e6030ee06eff9aef807ea.html, pp. 1-5.

International Search Report in Application No. PCT/CN2021/103478, mailed on Nov. 1, 2021.

* cited by examiner

```
┌─────────────────────────────────────────────────────────────┐
│ Provide a package structure in which there is an electrical │
│ fault, wherein the package structure comprises a substrate, │
│ a chip structure, and a plurality of interconnecting wires, │── S100
│ the chip structure is bonded to the substrate, and the      │
│ interconnecting wires electrically connect the chip         │
│ structure to the substrate                                  │
└─────────────────────────────────────────────────────────────┘
                              │
                              ▼
┌─────────────────────────────────────────────────────────────┐
│ Detect whether the electrical fault is in the interconnecting│
│ wires, and if the electrical fault is in the interconnecting│── S200
│ wires, determine that the electrical fault is caused by the │
│ interconnecting wires                                       │
└─────────────────────────────────────────────────────────────┘
                              │
                              ▼
┌─────────────────────────────────────────────────────────────┐
│ If the electrical fault is not in the interconnecting wires,│
│ break the interconnecting wires to electrically isolate the │
│ chip structure from the substrate, then detect whether the  │
│ electrical fault in the substrate, and if the electrical    │── S300
│ fault is able to be detected, determine that the electrical │
│ fault is caused by the substrate, or if the electrical fault│
│ is not able to be detected, determine that the electrical   │
│ fault is caused by the chip structure                       │
└─────────────────────────────────────────────────────────────┘
```

If it is determined, according to a hotspot analysis method, that an electrical fault in a package structure is not caused by an interconnecting wire, determine that there are a plurality of faults in the package structure and the interconnecting wire needs to be broken to electrically isolate a chip structure from a substrate, and continue to detect whether there is still an electrical fault in the package structure —— S510

If it is determined, according to the hotspot analysis method, that the electrical fault in the package structure is caused by the interconnecting wires, determine that the electrical fault is a single electrical fault in the package structure, then end the analysis —— S520

FIG. 11

FAULT ISOLATION ANALYSIS METHOD AND COMPUTER-READABLE STORAGE MEDIUM

CROSS-REFERENCE TO RELATED APPLICATIONS

This is a continuation of International Patent Application No. PCT/CN2021/103478 filed on Jun. 30, 2021, which claims priority to Chinese Patent Application No. 202110168367.4 filed on Feb. 7, 2021. The disclosures of the above-referenced applications are hereby incorporated by reference in their entirety.

BACKGROUND

Currently, with the continuous development of fabrication processes, device packaging has become increasingly complex. A substrate, a wire, a chip, etc. in a device all possibly cause a short circuit or an electric leakage fault in the device, and it is quite difficult to determine a position at which the short circuit or the electric leakage occurs in the device.

SUMMARY

The present disclosure relates to the field of failure analysis technologies, and more specifically to a fault isolation analysis method and a computer-readable storage medium.

The present disclosure provides a fault isolation analysis method, including: providing a package structure in which there is an electrical fault, the package structure includes a substrate, a chip structure, and a plurality of interconnecting wires, the chip structure is bonded to the substrate, and the interconnecting wires electrically connect the chip structure to the substrate; detecting whether the electrical fault is in the interconnecting wires, and if the electrical fault is in the interconnecting wires, determining that the electrical fault is caused by the interconnecting wires; and if the electrical fault is not in the interconnecting wires, breaking the interconnecting wires to electrically isolate the chip structure from the substrate, then detecting whether the electrical fault is in the package structure, and if the electrical fault is able to be detected, determining that the electrical fault is caused by the substrate, or if the electrical fault is not able to be detected, determining that the electrical fault is caused by the chip structure.

The present disclosure further provides a computer-readable storage medium. The computer-readable storage medium stores a computer program, and when the computer program is executed by a processor, steps of the method described in the foregoing embodiment are implemented.

BRIEF DESCRIPTION OF THE DRAWINGS

To describe the technical solutions in the embodiments of the present application or in the prior art more clearly, the following briefly describes the accompanying drawings required for the embodiments or the prior art. Apparently, the accompanying drawings in the following description show merely some embodiments of the present application, and persons of ordinary skill in the art may still derive other accompanying drawings from these accompanying drawings without creative efforts.

DETAILED DESCRIPTION

To facilitate the understanding of the present disclosure, various embodiments of the present disclosure are described more completely below with reference to the related accompanying drawings. The accompanying drawings show the preferred implementations of the present disclosure. However, the present disclosure is embodied in various forms without being limited to the implementations described in this specification. On the contrary, these implementations are provided for a more thorough and comprehensive understanding of content disclosed in the present disclosure.

It should be noted that when a component is "fastened to" another component, the component may be fastened to the another component directly or via an intermediate component. When a component is "connected to" another component, the component may be connected to the another component directly or via an intermediate component. The terms such as "vertical", "horizontal", "left", "right", "upper", "lower", "front", "rear", and "peripheral" used in this specification and similar expressions are described based on the orientations or position relationships shown in the accompanying drawings. These terms are merely intended to facilitate and simplify the description of the present disclosure, rather than to indicate or imply that the mentioned apparatus or component must have a specific orientation or must be constructed and operated in a specific orientation. Therefore, these terms should not be understood as a limitation to the present disclosure.

Unless otherwise defined, all technical and scientific terms used in this specification have the same meaning as commonly understood by persons skilled in the technical field of the present disclosure. The terms used in this specification of the present disclosure are merely for the purpose of describing specific embodiments, rather than to limit the present disclosure. The term "and/or" used in this specification includes any and all combinations of one or more of associated listed items.

An exploratory factor analysis (EFA) method most commonly used currently for analyzing a short circuit fault is a hotspot analysis method, but this method has specific limitations. Because two-dimensional analysis is adopted in thermal emission, when a short circuit fault in a device is analyzed by using the hotspot analysis method, which layer of a packaged semiconductor device is short-circuited cannot be determined. For a device with a stacked chip of a high polygon model (HPM), if a short circuit or an electric leakage phenomenon occurs in a middle mold core, a hotspot is possibly blocked by an upper mold core. Consequently, a fault in the middle mold core cannot be detected.

Currently, with the continuous development of fabrication processes, device packaging has become increasingly complex. A substrate, a wire, a chip, etc. in a device all possibly cause a short circuit or an electric leakage fault in the device, and it is quite difficult to determine a position at which the short circuit or the electric leakage occurs in the device. An EFA method most commonly used currently for analyzing a short circuit fault is a hotspot analysis method, but this method has specific limitations. Because two-dimensional analysis is adopted in thermal emission, when a short circuit fault in a device is analyzed by using the hotspot analysis method, if a hotspot is located in an overlapping region between a substrate, a wire, and a chip, which layer of a packaged semiconductor device is short-circuited cannot be determined. In this case, for a device with a stacked chip of a high polygon model, if a short circuit or an electric leakage phenomenon occurs in a middle mold core, a hotspot generated in the middle mold core is possibly blocked by an upper mold core. Consequently, a fault in the middle mold core cannot be detected.

Figure 1:
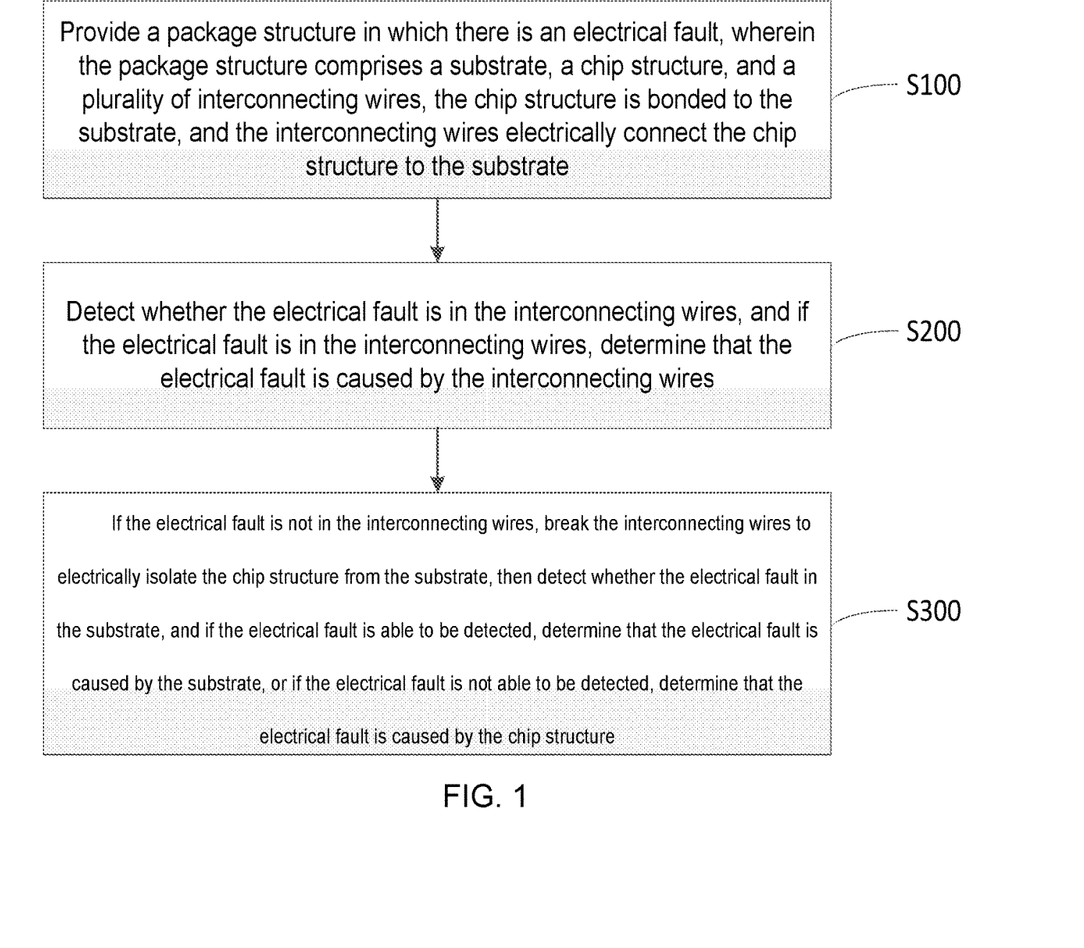
FIG. 1 is a method flowchart of a fault isolation analysis method according to an embodiment of the present disclosure.

Various embodiments of the present disclosure provide an effective fault isolation analysis method to analyze an electrical failure cause of a device and learn a position of a fault in the device. In an embodiment, the fault isolation analysis method provided in the present disclosure is mainly applied to a ball grid array (BGA) package device of a volatile storage device. FIG. 1 is a method flowchart of a fault isolation analysis method according to an embodiment of the present disclosure. In the embodiment, the fault isolation analysis method includes steps S100 to S300.

S100. Provide a package structure in which there is an electrical fault, where the package structure includes a substrate, a chip structure, and a plurality of interconnecting wires, the chip structure is bonded to the substrate, and the interconnecting wires electrically connect the chip structure to the substrate.

S200. Detect whether the electrical fault is in the interconnecting wires, and if the electrical fault is in the interconnecting wire, determine that the electrical fault is caused by the interconnecting wire.

S300. If the electrical fault is not in the interconnecting wires, break the interconnecting wires to electrically isolate the chip structure from the substrate, then detect whether the electrical fault is in the package structure, and if the electrical fault is able to be detected, determining that the electrical fault is caused by the substrate, or if the electrical fault is not able to be detected, determining that the electrical fault is caused by the chip structure.

Figure 2:
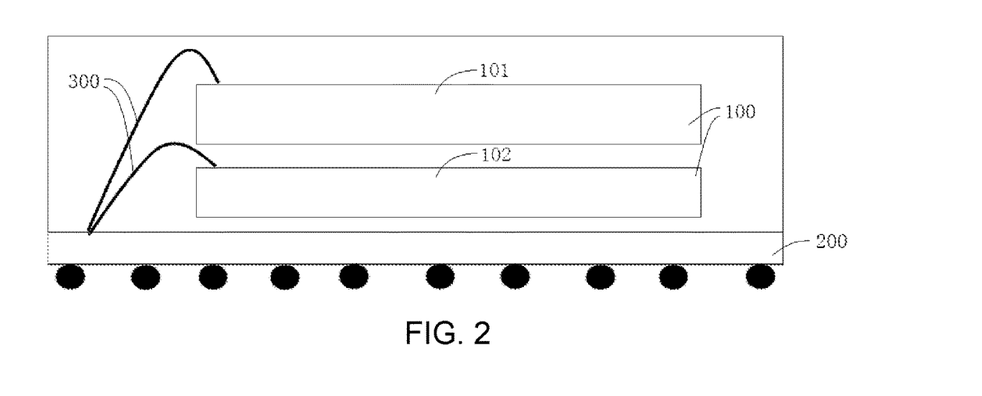
FIG. 2 is a structural block diagram of a package structure according to an embodiment of the present disclosure.

First, the package structure for which fault isolation analysis needs to be conducted is provided. In this embodiment, the package structure is a BGA package structure of a DRAM. FIG. 2 is a structural block diagram of a package structure according to an embodiment of the present disclosure. As shown in FIG. 2, the package structure mainly includes three types of components: a chip structure 100, a substrate 200, and interconnecting wires 300. The chip structure 100 may include one or more chips, and the chip structure is bonded to the substrate 200. In this embodiment, the chip structure 100 includes a first chip 101 and a second chip 102. The first chip 101 and the second chip 102 are electrically connected to the substrate 200 via the interconnecting wires 300 respectively.

During detecting whether the electrical fault is in the package structure, whether the electrical fault is in the interconnecting wires 300 that is first determined. Whether each interconnecting wire 300 is bridged or short-circuited with an adjacent wire or another nearby component is detected, to determine whether the electrical fault is in the interconnecting wires 300. When one or more interconnecting wires 300 are bridged or short-circuited, it is determined that the electrical fault is in the one or more interconnecting wires 300. This indicates that the electrical fault in the package structure is caused by the one or more interconnecting wires 300, and the one or more interconnecting wires 300 need to be repaired or replaced.

If there is no electrical fault in the interconnecting wires 300, it indicates that the electrical fault is caused by the chip structure 100 or the substrate 200. The interconnecting wires 300 connecting the chip structure 100 to the substrate 200 are broken to electrically isolate the chip structure 100 from the substrate 200, and then whether the electrical fault is in the package structure that is detected. If the electrical fault is in the package structure after the chip structure 100 that is electrically isolated, it is determined that the electrical fault is caused by the substrate 200. If the electrical fault is in the package structure after the chip structure 100 that is electrically isolated, it is determined that the electrical fault is caused by the chip structure 100.

Components in the package structure are electrically isolated one by one. After each component is isolated, whether the electrical fault is in the package structure that is detected. If the electrical fault is not in the package structure, it indicates that the electrical fault is caused by an isolated component. If the electrical fault is in the package structure, it indicates that the electrical fault is caused by a component that has not been isolated. The foregoing step is repeated until a component in which there is an electrical fault in the package structure is found. During electrical isolation of each component, it is necessary to ensure that functionality of the package structure can still be maintained when the package structure is opened to expose a component that needs to be isolated, to ensure that the chip structure, the substrate, and another component in the package structure can still work normally. Regardless of complexity of the package structure and a quantity of components in the package structure that possibly cause an electrical fault, when the fault isolation analysis method provided in the present disclosure is used to conduct failure analysis on the package structure, a fault position can be correctly found, and a specific component in which there is an electrical fault in the package structure can be determined.

In an embodiment, the electrical fault includes a short circuit and/or an electric leakage. There are many causes for an electrical fault in a semiconductor device. A short circuit and an electric leakage are the most common faults in the semiconductor device. Many internal and external factors possibly cause a short circuit and leakage in the semiconductor device. The electric leakage is usually current leakage caused by insulation damage or other causes, while the short circuit usually refers to that an internal circuit of a device or a part of the circuit is short-circuited. When the semiconductor device is faulty, a specific component that is of the device and in which there is an electrical fault first needs to be determined, and then a cause of the fault that occurs in the component can be further traced.

Figure 3:
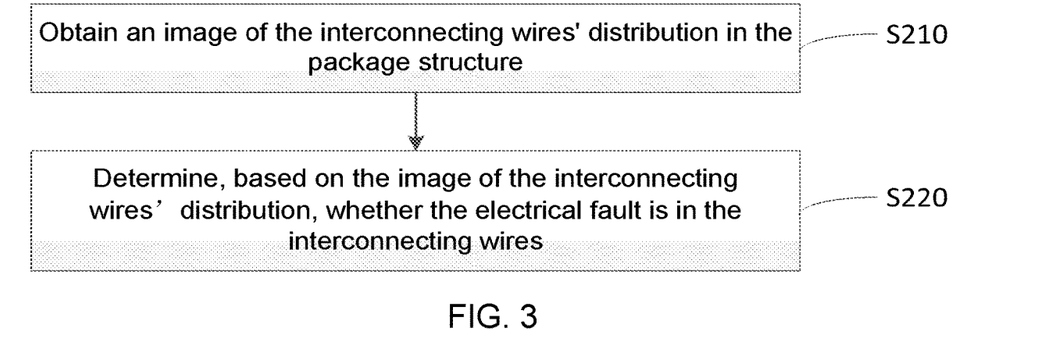
FIG. 3 is a flowchart of a method for determining whether the electrical fault is in interconnecting wires according to an embodiment of the present disclosure.

FIG. 3 is a flowchart of a method for determining whether there is an electrical fault in an interconnecting wire according to an embodiment of the present disclosure. In this embodiment, the detecting whether there is an electrical fault in the interconnecting wire in the package structure includes steps S210 and S220.

S210. Obtain an image of the interconnecting wires' distribution in the package structure.

S220. Determine, based on the image of the interconnecting wires' distribution, whether the electrical fault is in the interconnecting wires.

During detecting whether the electrical fault is in the interconnecting wires 300 in the package structure, an actual distribution status of the interconnecting wires 300 in the package structure first needs to be obtained. In this embodiment, an imaging technology is used to image the package structure, and an image of the interconnecting wires' 300 distribution in the package structure can be obtained without destroying a plastic package of the package structure. Then, whether the interconnecting wires 300 are abnormal is determined based on the image of the interconnecting wires' 300 distribution. For example, whether wires are crossed in the distribution image may be observed, to determine whether there is a short circuit electrical fault in the interconnecting wires 300.

In an embodiment, the package structure is irradiated by using a GE phoenix X-ray inspection machine, to obtain the image of the interconnecting wires' distribution in the package structure. In this embodiment, the imaging technology is an X-ray transmission imaging technology. Based on the X-ray transmission imaging technology and different thicknesses and density of various components in a device, X-ray absorption capabilities of the components are different. After X-rays pass through a plastic package layer, a transillumination image with different intensity difference distributions is formed. A flat-panel detector may display an intensity difference of the X-rays in an image form to implement high-precision imaging detection of the interconnecting wires 300 in the package structure and obtain the image of the interconnecting wires' 300 distribution, so that whether a defect exists in the interconnecting wires 300 can be accurately determined based on the image of the interconnecting wires' 300 distribution. The GE phoenix X-ray inspection machine has advantages of high resolution, high precision, anti-vibration, and the like, and is provided with comprehensive X-ray image analysis software, so that the GE phoenix X-ray inspection machine can extract any section to conduct shape and size measurement, thereby ensuring the reliability of an imaging detection result.

In an embodiment, the package structure is irradiated by using X-rays from at least a first direction and a second direction, to obtain images of the interconnecting wires' distribution in the package structure at least in the first direction and the second direction. When the component composition in the package structure is complex, a distribution status of the interconnecting wires 300 may also be relatively complex. From a certain angle of view, the interconnecting wires 300 are parallel to each other/do not intersect with each other, but from another angle of view, the interconnecting wires 300 may be crossed each other. Therefore, during actual detection, the package structure needs to be irradiated at at least two angles, namely the first direction and the second direction, by using the X-rays, to obtain the images of the interconnecting wires' 300 distribution in the first direction and the second direction; and whether a defect exists in the interconnecting wires 300 is determined based on the distribution images in the two directions. In this way, the reliability of an imaging detection result is improved. During actual detection, an appropriate X-ray irradiation angle may be selected according to the connection distribution design and a detection requirement of wires in the device.

In an embodiment, 360-degree irradiation is conducted around the package structure by using 3D-X-rays for implementing imaging. A specific method is to make an X-ray angle fixed and rotate the package structure 360 degrees to obtain a clearer result.

In an embodiment, the first direction is parallel to a horizontal placement direction of the package structure, and the second direction is perpendicular to the horizontal placement direction of the package structure. In this embodiment, the first direction is along a side surface of the package structure, and the second direction is along a top surface of the package structure. By irradiating the package structure from both the side surface and the top surface by using X-rays, distribution statuses of the interconnecting wires 300 in the package structure in a horizontal direction and a vertical direction may be obtained. This ensures that experimenters can more clearly and intuitively observe whether each interconnecting wire 300 is bridged or short-circuited with an adjacent wire or another nearby component. During actual detection, according to the connection distribution design and a detection requirement of the interconnecting wires 300 in the device, the package structure may be irradiated from another preferred oblique angle by using X-rays, to obtain a distribution image that can more clearly present a distribution status of the interconnecting wires 300 in the package structure.

Figure 4:
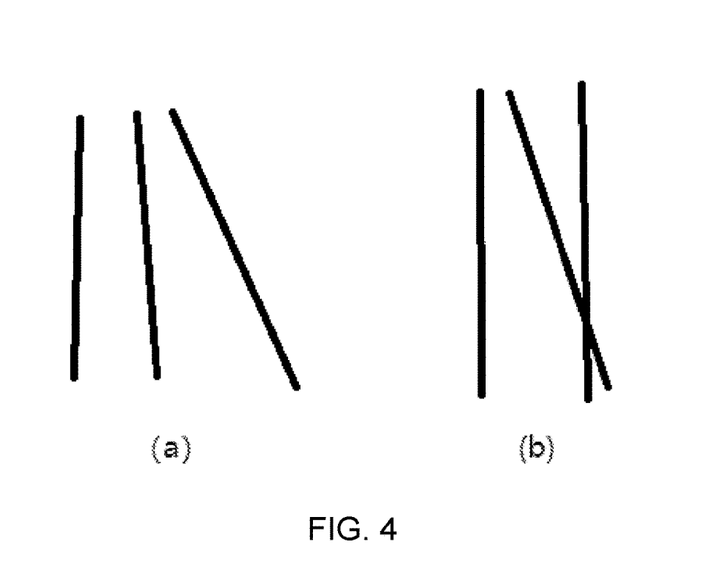
FIG. 4 is a schematic diagram of determining a short circuit fault in interconnecting wires according to an embodiment of the present disclosure.

In an embodiment, the interconnecting wire includes a gold wire. When a fabrication problem occurs in a gold wire bonding process, gold wires are possibly crossed. When it is found that there are crossed gold wires in a distribution image, it may be determined that a short circuit problem occurs in the interconnecting wires 300. FIG. 4 is a schematic diagram of determining a short circuit fault in interconnecting wires according to an embodiment of the present disclosure. Panel (a) in FIG. 4 is a schematic diagram of normal interconnecting wires in which there is no electrical fault. It can be seen that the interconnecting wires 300 are parallel to each other/do not intersect with each other. Panel (b) in FIG. 4 is a schematic diagram of interconnecting wires in which there is an electrical fault. The figure shows a case in which two interconnecting wires 300 are crossed. This case leads to a short circuit electrical fault in a package structure.

Figure 5:
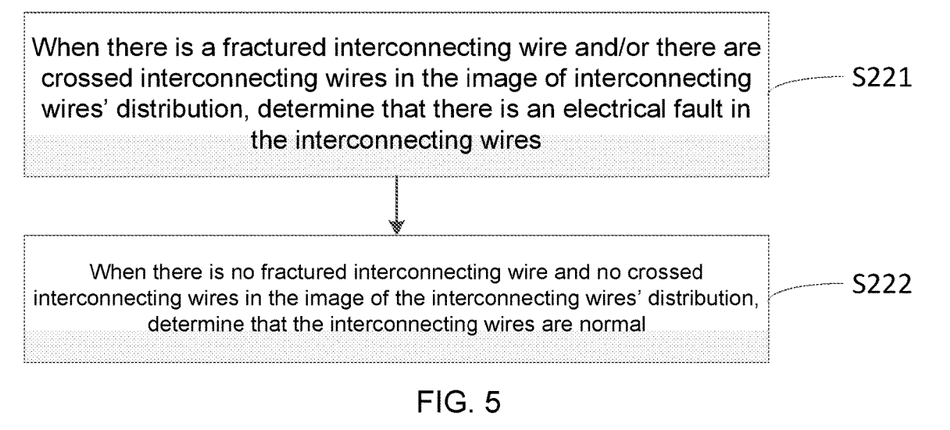
FIG. 5 is a flowchart of a method for determining, based on an image of interconnecting wires' distribution, whether there is an electrical fault according to an embodiment of the present disclosure.

FIG. 5 is a flowchart of a method for determining, based on an image of the interconnecting wires' distribution, whether there is an electrical fault according to an embodiment of the present disclosure. In this embodiment, the determining, based on the image of the interconnecting wires' distribution, whether there is an electrical fault in the interconnecting wire includes the following steps S221 and S222.

S221. When there is a fractured interconnecting wire and/or there are crossed interconnecting wires in an image of the interconnecting wires' distribution, determine that the electrical fault is in the interconnecting wires.

S222. When there is no fractured interconnecting wire and no crossed interconnecting wires in the image of the interconnecting wires' distribution, determine that the interconnecting wires are normal, the electrical fault is not in the interconnecting wires.

A process of determining, based on the image of the interconnecting wires' 300 distribution, whether the electrical fault is in the interconnecting wires 300 that is described by using the package structure shown in FIG. 2 as an example. The package structure includes two chips: the first chip 101 and the second chip 102, and the first chip 101 and the second chip 102 are respectively connected to the substrate 200 via the interconnecting wires 300. When there is a short circuit and/or an electric leakage in the package structure shown in FIG. 2, the package structure is first irradiated by using X-rays, to obtain a distribution image, and whether the interconnecting wires 300 connecting the first chip 101 and the second chip 102 to the substrate 200 are short-circuited is determined based on the distribution image. In actual application, according to test requirements, the package structure may be irradiated from a plurality of different angles such as directions along the top surface and the side surface.

After the images of the interconnecting wires' 300 distribution in the package structure at different angles are obtained, image recognition is performed on the plurality of distribution images one by one to determine whether there is an abnormal case such as fracture, damage, and/or crossing in the distribution status of the interconnecting wires 300 presented in the distribution images. If the interconnecting wire 300 is fractured and/or damaged, it indicates that there is an electric electrical fault in the interconnecting wire 300. If every two of two or more interconnecting wires 300 are crossed each other in the distribution image, it indicates that there is a short circuit electrical fault in the interconnecting wires 300. If there is no abnormal phenomenon in each interconnecting wire 300 in the distribution images, it indicates that the electrical fault in the package structure does not occur in the interconnecting wires 300, and it is determined that the interconnecting wires 300 are normal.

In an embodiment, the interconnecting wires are broken by using a grinding machine. When it is determined that the interconnecting wires 300 are normal and are not faulty, the chip structure 100 and the substrate 200 need to be isolated one by one to determine a specific layer on which the electrical fault occurs. The chip structure 100 is isolated from the substrate 200 by breaking the interconnecting wires 300 for conducting the chip structure 100 and the substrate 200. In this embodiment, the grinding machine with high processing accuracy is used to drill the package structure at a position of the interconnecting wire 300 that needs to be broken, so as to break the interconnecting wire 300. When the grinding machine is used to break the interconnecting wire 300, it is necessary to ensure that other components in the package structure is not damaged, that is, the functional effectiveness of other components of the package structure needs to be ensured.

In an embodiment, the grinding machine includes an analog selected area preparation (ASAP)-1 IPS milling system from Nanolab Technologies Inc. In this example, the interconnecting wire 300 is broken by using the ASAP milling system. By using the latest digital technology, the ASAP-1 IPS milling system makes the grinding process highly automated, programmable, and the like, so that experimental samples can be ground to be thinner by using the ASAP-1 IPS milling system, a grinding size/thickness is more precise, and flatter polishing and more accurate processing are implemented. In this case, it is ensured that each important experimental sample can be processed to be in best to-be-tested state.

Figure 6:
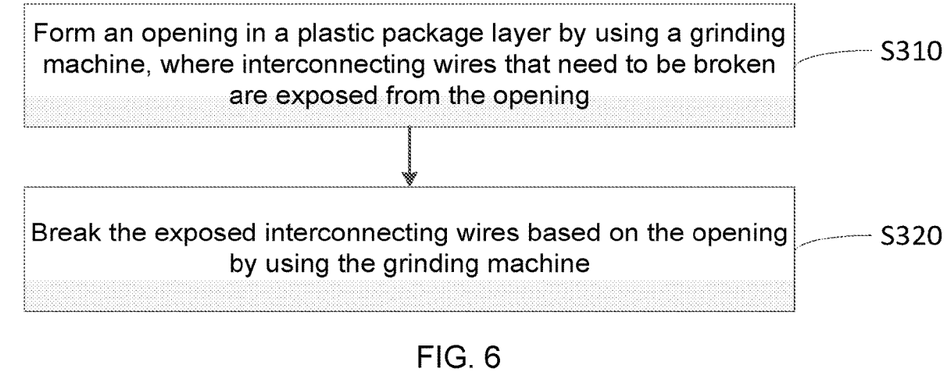
FIG. 6 is a flowchart of a method for breaking interconnecting wires according to an embodiment of the present disclosure.

FIG. 6 is a flowchart of a method for breaking interconnecting wires according to an embodiment of the present disclosure. In this embodiment, the package structure further includes a plastic package layer, and the plastic package layer is located on a surface of the substrate and implements plastic packaging of the chip structure 100 and the interconnecting wires 300 in the package structure. The breaking the interconnecting wires by using a grinding machine includes the following steps S310 and S320.

S310. Form an opening in the plastic package layer by using the grinding machine, where the interconnecting wires that need to be broken are exposed from the opening.

S320. Break the exposed interconnecting wires based on the opening by using the grinding machine.

An ASAP milling system completes an operation of breaking the interconnecting wires 300. The ASAP milling system forms a cuboid opening in the plastic package layer through drilling, to expose the interconnecting wires in the package structure through the opening. Then, the ASAP milling system is set based on positions of the interconnecting wires 300 that need to be broken, to continue drilling downward at the opening. At this time, operation parameters corresponding to a length, a width, and a depth of the opening need to be set based on the positions of the interconnecting wires 300.

Figure 7:
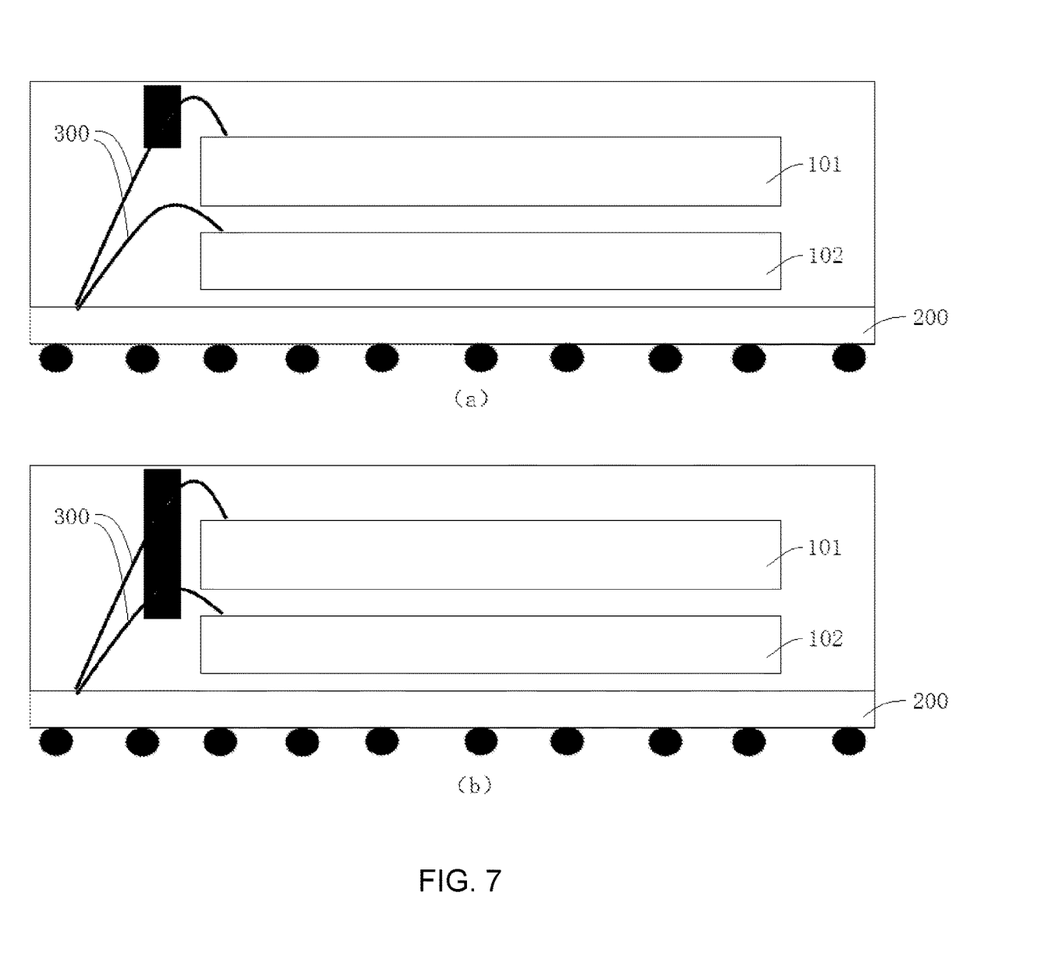
FIG. 7 is a schematic diagram of an operation of breaking interconnecting wires according to an embodiment of the present disclosure.
Figure 8:
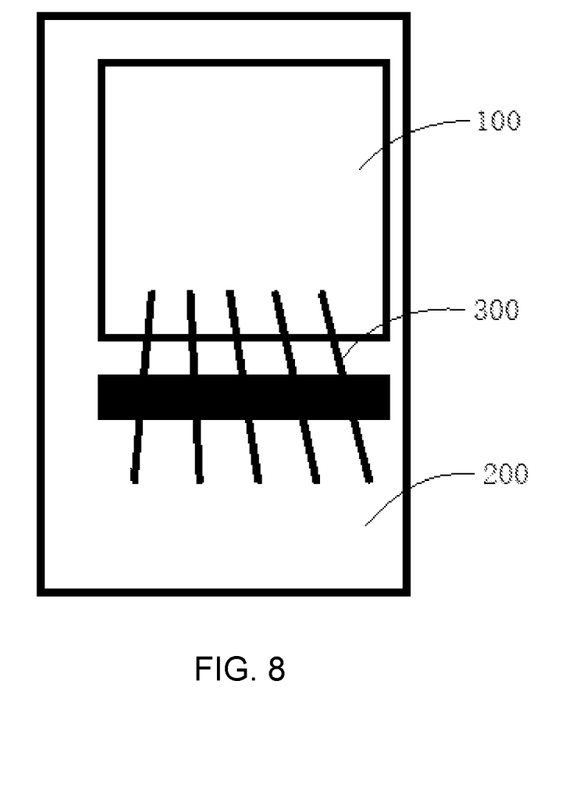
FIG. 8 is a schematic top view of an operation of breaking interconnecting wires according to an embodiment of the present disclosure.

The process of breaking the interconnecting wires 300 is described by using the package structure shown in FIG. 2 as an example. FIG. 7 is a schematic diagram of an operation of breaking interconnecting wires according to an embodiment of the present disclosure. When the interconnecting wire 300 connecting the first chip 101 to the substrate 200 needs to be broken, parameters of the ASAP milling system are set based on a position of the interconnecting wire 300 in the package structure to set a length, a width, and a depth of an opening. FIG. 8 is a schematic top view of an operation of breaking interconnecting wires according to an embodiment of the present disclosure. A black rectangle in FIG. 8 is an area that needs to be drilled by the ASAP milling system. The ASAP milling system is controlled to mill the package structure to an opening at a position of a black rectangle in panel (a) in FIG. 7. When the opening is opened to this position, the interconnecting wire 300 connecting the first chip 101 to the substrate 200 may be broken.

Similarly, when the interconnecting wire 300 connecting the second chip 102 to the substrate 200 needs to be broken, milling may be continued downward based on the opening in panel (a) in FIG. 7. Parameters of the ASAP milling system are set based on a position of the interconnecting wire 300 in the package structure to set a length, a width, and a depth of an opening, and the ASAP milling system is made to mill the opening to a position of a black rectangle in panel (b) in FIG. 7. In this case, the interconnecting wire 300 connecting the second chip 102 to the substrate 200 is broken.

Figure 9:
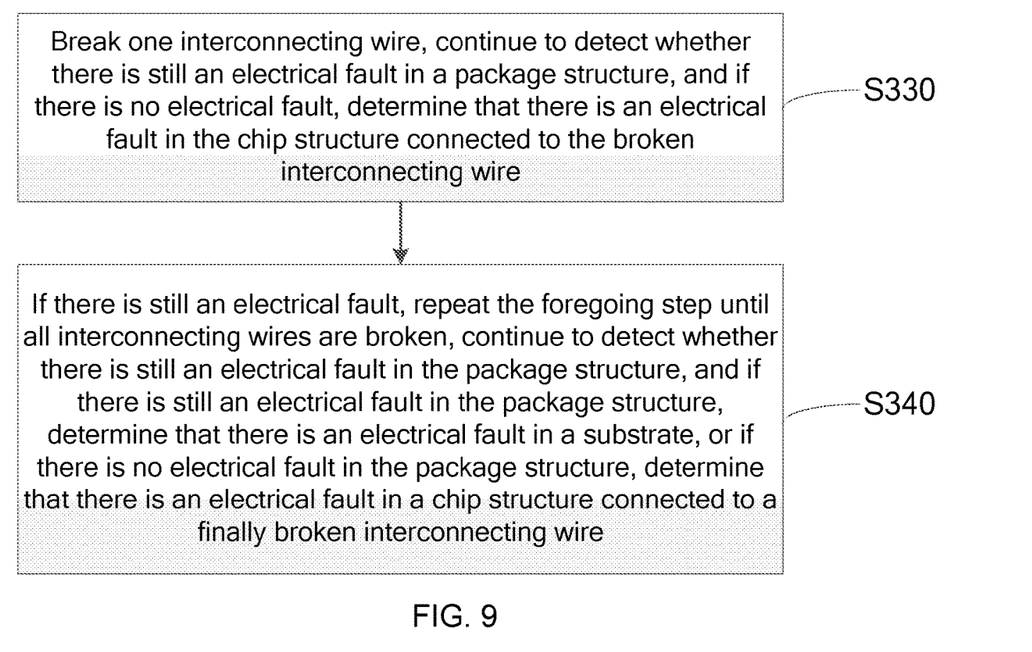
FIG. 9 is a flowchart of a method for determining whether the electrical fault is in a chip structure or a substrate according to an embodiment of the present disclosure.

FIG. 9 is a flowchart of a method for determining whether the electrical fault is in a chip structure or a substrate according to an embodiment of the present disclosure. In this embodiment, the package structure includes a plurality of stacked chip structures, all the chip structures are electrically connected to the substrate via interconnecting wires; and breaking the interconnecting wires to electrically isolate the chip structure from the substrate, detecting whether the electrical fault is in the package structure, and if the electrical fault is in the package structure, determining that the electrical fault is caused by the substrate, or if the electrical fault is not in the package structure, determining that electrical fault is caused by the chip structure includes the following steps S330 and S340.

S330. Break one of the interconnecting wires, then detect whether the electrical fault is in the package structure, and if the electrical fault is not able to be detected, determine that the electrical fault is caused by a chip structure connected to the broken interconnecting wire.

S340. If the electrical fault is able to be detected, repeat the foregoing step until all the interconnecting wires are broken, then detect whether the electrical fault is in the package structure, and if the electrical fault is in the package structure, determine that the electrical fault is caused by the substrate, or if the electrical fault is not in the package structure, determine that the electrical fault is caused by a chip structure connected to a finally broken interconnecting wire.

The process of determining whether there is an electrical fault in the chip structure 100 or the substrate 200 is described by using the package structure shown in FIG. 2 as an example. The package structure includes two stacked chips: the first chip 101 and the second chip 102. The first chip 101 and the second chip 102 are electrically connected to the substrate 200 via the interconnecting wires 300 respectively. First, the interconnecting wire 300 connecting the first chip 101 to the substrate 200 is broken by using an ASAP milling system, to electrically isolate the first chip 101. After the first chip 101 is isolated, whether the electrical fault is in the package structure that is detected. If the electrical fault is not in the package structure, it indicates that the electrical fault is caused by the first chip 101 and the second chip 102 and the substrate are normal. If the electrical fault is in the package structure, it indicates that the electrical fault does not occur in the second chip 102 and the second chip 102 is normal.

When it is determined that the second chip 102 is normal, a position of the electrical fault further needs to be determined after the second chip 102 is isolated. Drilling is further conducted downward by using the ASAP milling system, to break the interconnecting wire 300 connecting the second chip 102 to the substrate 200 to electrically isolate the second chip 102. After the second chip 102 is isolated, whether there is still an electrical fault in the package structure is detected. If the electrical fault in the package structure disappears, it indicates that the electrical fault occurs in the first chip 101 and the second chip 102 and the substrate are normal. If there is still an electrical fault in the package structure, it indicates that the electrical fault occurs in the substrate and the first chip 101 and the second chip 102 are normal.

Components in the package structure are electrically isolated one by one. After electrical isolation is conducted each time, whether the electrical fault is in the package structure that is detected. If the electrical fault is not in the package structure, it indicates that the electrical fault is in an isolated component. If the electrical fault is in the package structure, it indicates that the electrical fault is caused by a component that has not been isolated. The foregoing step is repeated until a component in which there is an electrical fault in the package structure is found. During electrical isolation of each component, it is necessary to ensure that functionality of the package structure can be maintained when the package structure is opened to expose a component that needs to be isolated, to ensure that the chip structure, the substrate, and another component in the package structure can still work normally.

Regardless of complexity of the package structure and a quantity of components in the package structure that possibly cause an electrical fault, the fault isolation analysis method provided in the present disclosure is used to conduct failure analysis on the package structure, a fault position can be correctly found, and a specific component in which there is an electrical fault in the package structure can be determined.

In an embodiment, the chip structure includes a memory chip.

In an embodiment, the chip structure includes a dynamic random access memory chip.

Figure 10:
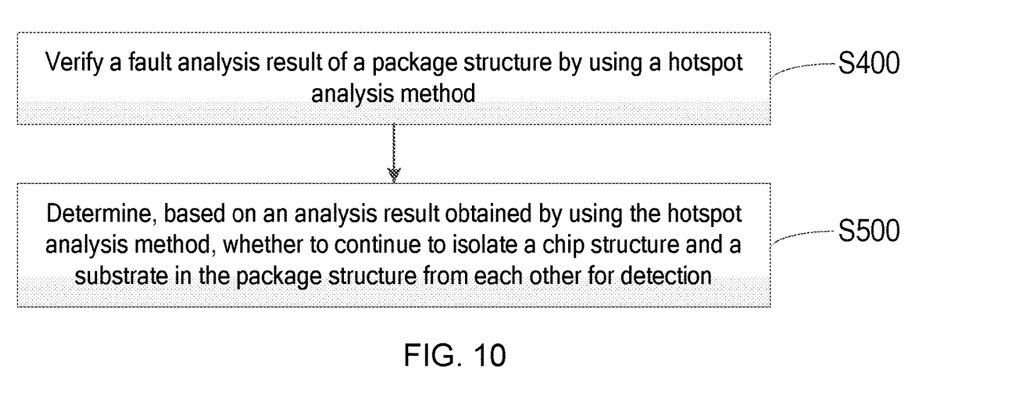
FIG. 10 is a flowchart of a method for verifying a fault analysis result by using a hotspot analysis method according to an embodiment of the present disclosure.

FIG. 10 is a flowchart of a method for verifying a fault analysis result by using a hotspot analysis method according to an embodiment of the present disclosure. In this embodiment, when the electrical fault is in the interconnecting wires, the fault isolation analysis method further includes the following steps S400 and S500.

S400. Verify a fault analysis result of the package structure by using the hotspot analysis method.

S500. Determine, based on an analysis result obtained by using the hotspot analysis method, whether to continue to isolate the chip structure and the substrate in the package structure from each other for detection.

When an electrical failure occurs in a semiconductor device, the electrical failure is a single failure in most cases. It is highly unlikely that electrical failures occur in two components at the same time, but it is still likely that there are multiple failures. Therefore, after the failure analysis on the package structure is completed according to the steps in the foregoing embodiment, the failure analysis result can be further verified by using the hotspot analysis method, to prevent an omission of a failure analysis result and improve the detection accuracy of the fault isolation analysis method. If the analysis result obtained by using the hotspot analysis method matches the fault analysis result, it indicates that the fault analysis result obtained in the foregoing electrical failure analysis process is accurate. In this case, there is no need to continue to isolate the chip structure 100 and the substrate 200 in the package structure from each other for detection. If the analysis result obtained by using the hotspot analysis method does not match the fault analysis result, it indicates that there is an omission of a fault analysis result. In this case, it is necessary to continue to isolate the chip structure 100 and the substrate 200 in the package structure from each other for detection.

Figure 11:
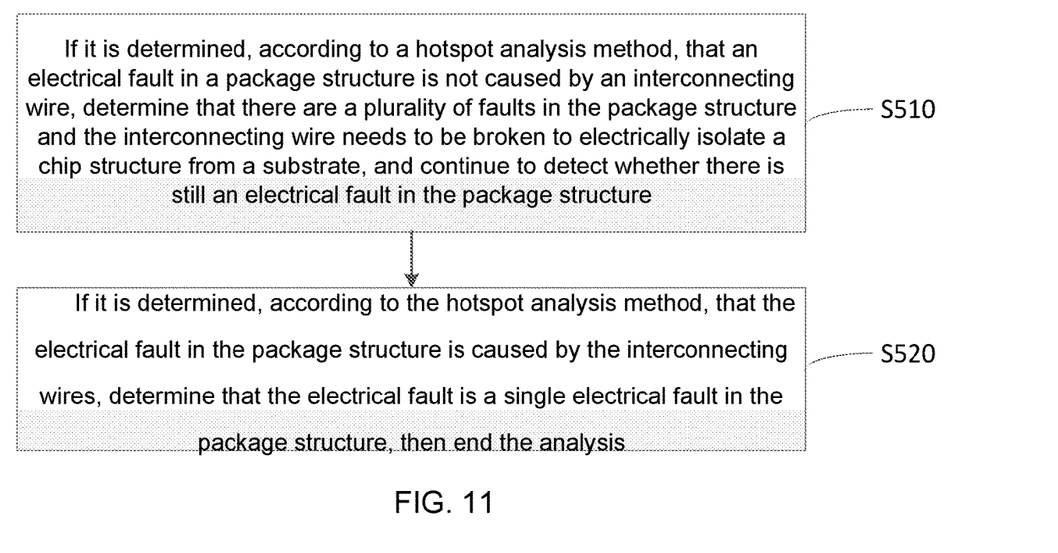
FIG. 11 is a flowchart of a method for determining whether to isolate a chip structure for detection according to an embodiment of the present disclosure.

FIG. 11 is a flowchart of a method for determining whether to isolate a chip structure for detection according to an embodiment of the present disclosure. In this embodiment, the determining, based on an analysis result obtained by using the hotspot analysis method, whether to continue to isolate the chip structure and the substrate in the package structure from each other for detection includes the following steps S510 and S520.

S510. If it is determined, according to the hotspot analysis method, that the electrical fault in the package structure is not caused by the interconnecting wire, determine that there are a plurality of electrical faults in the package structure and the interconnecting wires need to be broken to electrically isolate the chip structure from the substrate, and then detect whether the electrical fault is in the structure.

S520. If it is determined, according to the hotspot analysis method, that the electrical fault in the package structure is caused by the interconnecting wires, determine that the electrical fault is a single electrical fault in the package structure, then end the analysis.

When an analysis result obtained when electrical failure analysis is conducted on the package device by using the hotspot analysis method shows that a hotspot does not appear near the interconnecting wire 300, but it is determined, based on the distribution image obtained by using the X-rays, that a short circuit problem occurs in the interconnecting wire 300, it proves that there are a plurality of failure causes in the package device. In this case, the chip structure 100 and the substrate 200 in the package device need to be further isolated from each other to determine whether there is an electrical fault in the chip structure 100 and/or the substrate 200. Conversely, if an analysis result obtained by using the hotspot analysis method shows that a hotspot appears near the interconnecting wire 300, and it is determined, based on the distribution image obtained by using the X-rays, that a fault occurs in the interconnecting wire 300, it proves that a single failure occurs in the package device and that the fault analysis result is accurate. In this case, the electrical failure analysis process of the package device is completed.

Similarly, when it is determined, based on a fault analysis result, that the electrical fault occurs in the chip structure 100 or the substrate 200, but an analysis result obtained when electrical failure analysis is conducted on the package device by using the hotspot analysis method shows that a hotspot does not appear near the chip structure 100 or the substrate 200, it also indicates that there are multiple failure causes in the package device. In this case, the components in the package device need to be further electrically isolated from each other, and electrical failure analysis needs to be conducted again, to prevent an omission of a failure analysis result. Conversely, if it is determined, based on a fault analysis result, that the electrical fault occurs in the chip structure 100 or the substrate 200, and an analysis result obtained by using the hotspot analysis method shows that a hotspot also appears on the chip structure 100 or the substrate 200, it indicates that the fault analysis result is correct.

In an embodiment, a pin (Pin) position of the short circuit is further analyzed by using a probe measurement platform, to verify whether an analysis result obtained by using the fault isolation analysis method is correct. A current-voltage (I-V) curve graph file corresponding to the pin position is obtained by using the probe measurement platform, and whether there is a short circuit or an electric leakage fault at the pin position is determined based on the current-voltage (I-V) curve graph file. If an analysis result obtained based on the current-voltage (I-V) curve graph file matches the fault analysis result obtained by using this method, it indicates that the fault analysis result is correct. In this embodiment, the short circuit electrical fault can be verified by using the probe measurement platform.

An embodiment provides a computer-readable storage medium. The computer-readable storage medium stores a computer program, and when the computer program is executed by a processor, the steps in the foregoing method embodiments are implemented.

Persons of ordinary skill in the art can understand that all or some of processes for implementing the methods of the foregoing embodiments can be completed by instructing relevant hardware through a computer program. The computer program may be stored in a non-volatile computer-readable storage medium. When the computer program is executed, processes of the embodiments of the foregoing methods may be included. Any reference to a memory, a storage, a database, or other media used in the embodiments provided in the present disclosure may include at least one of a non-volatile memory and a volatile memory. The non-volatile memory may include a read-only memory (ROM), a magnetic tape, a floppy disk, a flash memory, an optical memory, or the like. The volatile memory may include a random-access memory (RAM) or an external cache memory. As an illustration and not a limitation, the RAM may be in various forms, for example, a static random-access memory (SRAM) or a dynamic random-access memory (DRAM).

The technical features of the above embodiments can be combined in any manner. For concise description of these embodiments, all possible combinations of all technical features of the embodiments may not be described; however, these combinations of technical features should be construed as disclosed in this specification provided that no contradiction occurs.

Several implementations in the present disclosure are merely described in more detail in the foregoing embodiments, but they should not therefore be construed as limiting the scope of the patent application. It should be noted that persons of ordinary skill in the art can further make several variations and improvements without departing from the conception of the present disclosure. These variations and improvements all fall within the protection scope of the present disclosure. Therefore, the protection scope of the patent application shall be subject to the protection scope defined by the claims.

What is claimed is:

1. A fault isolation analysis method, comprising:
    providing a package structure in which there is an electrical fault, wherein the package structure comprises a substrate, a chip structure, and a plurality of interconnecting wires, the chip structure is bonded to the substrate, and the interconnecting wires electrically connect the chip structure to the substrate;
    detecting whether the electrical fault is in the interconnecting wires, and if the electrical fault is in the interconnecting wires, determining that the electrical fault is caused by the interconnecting wires; and
    if the electrical fault is not in the interconnecting wires, breaking the interconnecting wires to electrically isolate the chip structure from the substrate, then detecting whether the electrical fault is in the substrate, and if the electrical fault is able to be detected, determining that the electrical fault is caused by the substrate, or if the electrical fault is not able to be detected, determining that the electrical fault is caused by the chip structure;
    wherein when the electrical fault is in the interconnecting wires, the fault isolation analysis method further comprises:
    verifying a fault analysis result of the package structure by using a hotspot analysis method; and
    determining, based on an analysis result obtained by using the hotspot analysis method, whether to continue to isolate the chip structure and the substrate in the package structure from each other for detection.

2. The fault isolation analysis method according to claim 1, wherein the electrical fault comprises a short circuit and/or an electric leakage.

3. The fault isolation analysis method according to claim 1, wherein the detecting whether there is an electrical fault in the interconnecting wire in the package structure comprises:
    obtaining an image of the interconnecting wires' distribution in the package structure, and
    determining, based on the image of the interconnecting wires' distribution, whether the electrical fault is in the interconnecting wires.

4. The fault isolation analysis method according to claim 3, wherein the package structure is irradiated by using X-rays to obtain the image of the interconnecting wires' distribution in the package structure.

5. The fault isolation analysis method according to claim 4, wherein the package structure is irradiated by using the X-rays from at least a first direction and a second direction to obtain images of the interconnecting wires' distribution in the package structure at least in the first direction and the second direction.

6. The fault isolation analysis method according to claim 5, wherein the first direction is parallel to a horizontal placement direction of the package structure, and the second direction is perpendicular to the horizontal placement direction of the package structure.

7. The fault isolation analysis method according to claim 1, wherein the interconnecting wires comprise a gold wire.

8. The fault isolation analysis method according to claim 3, wherein the determining, based on the image of the interconnecting wires' distribution, whether the electrical fault is in the interconnecting wires comprises:
when there is a fractured interconnecting wire and/or there are crossed interconnecting wires in the image of the interconnecting wires' distribution, determining that the electrical fault is in the interconnecting wires; and
when there is no fractured interconnecting wire and no crossed interconnecting wires in the image of the interconnecting wires' distribution, determining that the interconnecting wires are normal, the electrical fault is not in the interconnecting wires.

9. The fault isolation analysis method according to claim 1, further comprising
breaking the interconnecting wires by using a grinding machine.

10. The fault isolation analysis method according to claim 9, wherein the package structure further comprises a plastic package layer; the plastic package layer is located on a surface of the substrate and implements a plastic packaging of the chip structure and the interconnecting wires; and the breaking the interconnecting wires by using a grinding machine comprises:
forming an opening in the plastic package layer by using the grinding machine, wherein the interconnecting wires that need to be broken are exposed from the opening; and
breaking the exposed interconnecting wires based on the opening by using the grinding machine.

11. The fault isolation analysis method according to claim 1, wherein the package structure comprises a plurality of stacked chip structures; all the chip structures are electrically connected to the substrate via the interconnecting wires; and breaking the interconnecting wires to electrically isolate the chip structure from the substrate, detecting whether the electrical fault is in the package structure, and if the electrical fault is in the package structure, determining that the electrical fault is caused by the substrate, or if the electrical fault is not in the package structure, determining that the electrical fault is caused by the chip structure comprises:
breaking one of the interconnecting wires, then detecting whether the electrical fault is in the package structure, and if the electrical fault is not able to be detected, determining that the electrical fault is caused by a chip structure connected to the broken interconnecting wire; and
if the electrical fault is able to be detected, repeating the foregoing step until all the interconnecting wires are broken, then detecting whether the electrical fault is in the package structure, and if the electrical fault is in the package structure, determining that the electrical fault is caused by the substrate, or if the electrical fault is not in the package structure, determining that the electrical fault is caused by a chip structure connected to a finally broken interconnecting wire.

12. The fault isolation analysis method according to claim 1, wherein the chip structure comprises a memory chip.

13. The fault isolation analysis method according to claim 12, wherein the chip structure comprises a dynamic random access memory chip.

14. The fault isolation analysis method according to claim 1, wherein the determining, based on an analysis result obtained by using the hotspot analysis method, whether to continue to isolate the chip structure and the substrate in the package structure from each other for detection comprises:
if it is determined, according to the hotspot analysis method, that the electrical fault in the package structure is not caused by the interconnecting wire, determining that there are a plurality of electrical faults in the package structure and the interconnecting wires need to be broken to electrically isolate the chip structure from the substrate, and then detecting whether the electrical fault is in the substrate; and
if it is determined, according to the hotspot analysis method, that the electrical fault in the package structure is caused by the interconnecting wires, determining that the electrical fault is a single electrical fault in the package structure, then ending the analysis.

15. A non-transitory computer-readable storage medium having
a computer program stored thereon, wherein when the computer program is executed by a processor, steps of the method according to claim 1 are implemented.

* * * * *